(12) United States Patent
Wu et al.

(10) Patent No.: US 7,719,064 B2
(45) Date of Patent: May 18, 2010

(54) HIGH VOLTAGE CMOS DEVICES

(75) Inventors: Chen-Bau Wu, Zhubei (TW);
Chien-Shao Tang, Hsinchu (TW);
Robin Hsieh, Hsin Chu (TW);
Ruey-Hsin Liu, Hsin-Chu (TW);
Shun-Liang Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 208 days.

(21) Appl. No.: 12/100,888

(22) Filed: Apr. 10, 2008

(65) Prior Publication Data
US 2008/0191291 A1    Aug. 14, 2008

Related U.S. Application Data

(63) Continuation of application No. 11/301,203, filed on Dec. 12, 2005, now Pat. No. 7,372,104.

(51) Int. Cl.
*H01L 29/78* (2006.01)
(52) U.S. Cl. .................................. 257/409; 257/335
(58) Field of Classification Search ................ 257/335, 257/409
See application file for complete search history.

(56) References Cited

U.S. PATENT DOCUMENTS

| | | | |
|---|---|---|---|
| 6,144,069 A | 11/2000 | Tung | |
| 6,238,959 B1 | 5/2001 | Tung | |
| 6,277,675 B1 | 8/2001 | Tung | |
| 6,333,234 B1 | 12/2001 | Liu | |
| 6,399,468 B2 | 6/2002 | Nishibe et al. | |
| 6,455,893 B1 | 9/2002 | Gehrmann et al. | |
| 6,608,336 B2 | 8/2003 | Kikuchi et al. | |
| 6,750,489 B1 | 6/2004 | Merrill | |
| 6,911,694 B2 | 6/2005 | Negoro et al. | |
| 2002/0053698 A1 | 5/2002 | Rumennik et al. | |
| 2006/0006462 A1 | 1/2006 | Chang et al. | |

OTHER PUBLICATIONS

Pritiskutch, J., et al., "Understanding LDMOS Device Fundamentals," AN-1226 Application Note (Jul. 2000) pp. 1-4.

*Primary Examiner*—Douglas M Menz
(74) *Attorney, Agent, or Firm*—Slater & Matsil, L.L.P.

(57) ABSTRACT

A transistor suitable for high-voltage applications is provided. The transistor is formed on a substrate having a deep well of a first conductivity type. A first well of the first conductivity type and a second well of a second conductivity type are formed such that they are not immediately adjacent each other. The well of the first conductivity type and the second conductivity type may be formed simultaneously as respective wells for low-voltage devices. In this manner, the high-voltage devices may be formed on the same wafer as low-voltage devices with fewer process steps, thereby reducing costs and process time. A doped isolation well may be formed adjacent the first well on an opposing side from the second well to provide further device isolation.

16 Claims, 9 Drawing Sheets

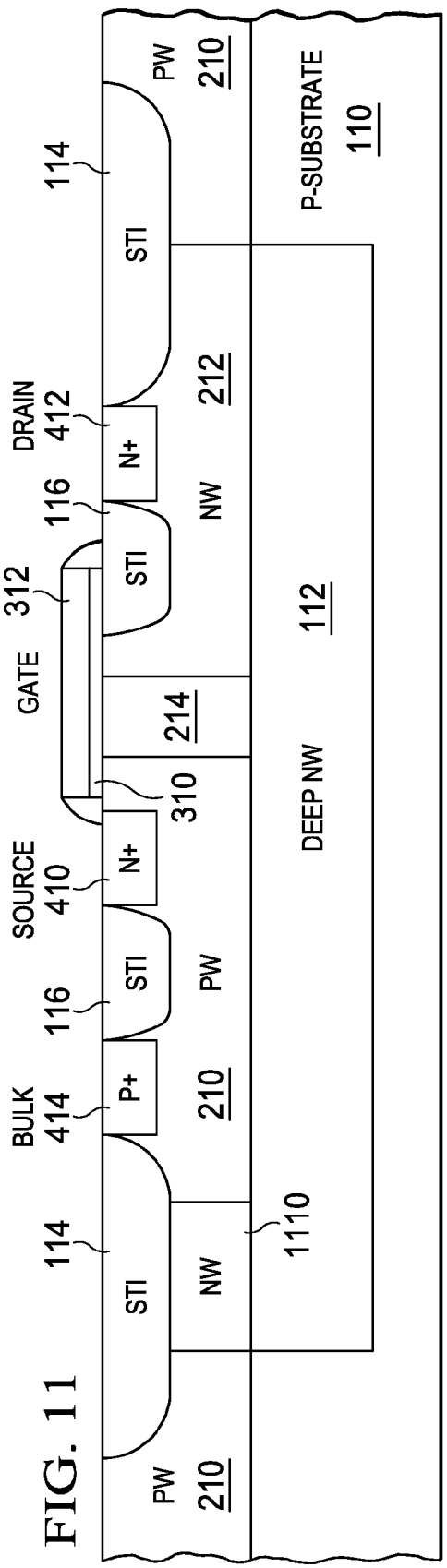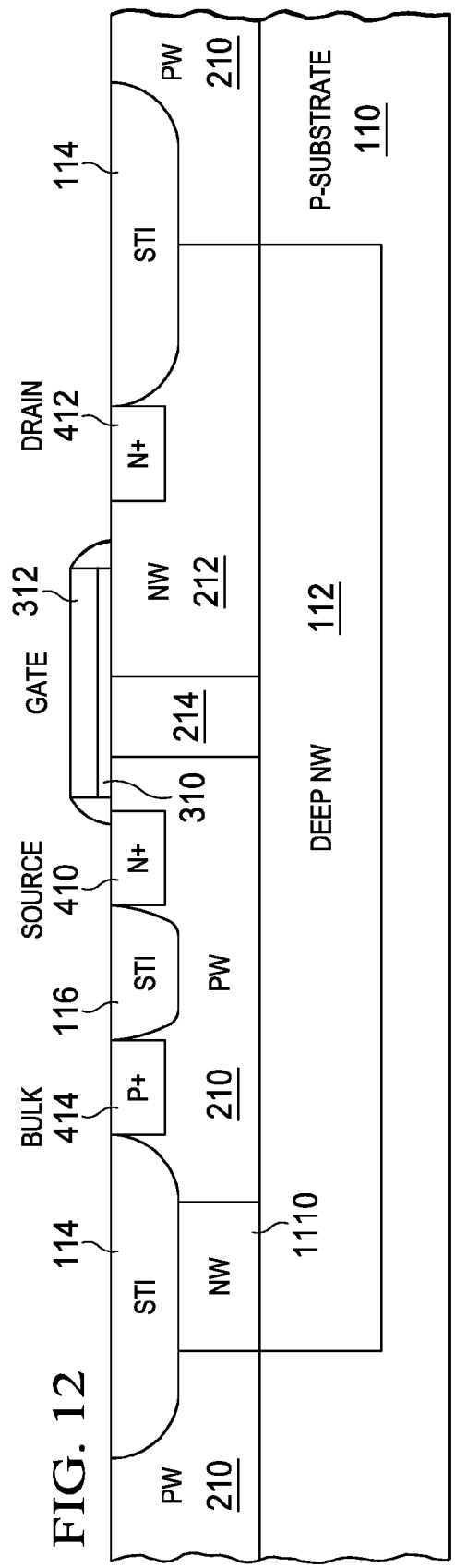

HIGH VOLTAGE CMOS DEVICES

This application is a continuation of patent application Ser. No. 11/301,203, entitled "High Voltage CMOS Devices," filed on Dec. 12, 2005, now U.S. Pat. No. 7,372,104, which application is incorporated herein by reference.

TECHNICAL FIELD

The present invention relates generally to semiconductor devices and, more particularly, to high-voltage semiconductor devices.

BACKGROUND

Size reduction of complementary metal-oxide-semiconductor (CMOS) devices, such as transistors, has enabled the continued improvement in speed, performance, density, and cost per unit function of integrated circuits over the past few decades. As sizes are reduced, there has been a trend to integrate more functions on a single chip, some of which require higher voltage levels. The use of higher voltages with shorter gate length MOSFETs, however, may create undesirable effects, such as punch-through.

Generally, punch-through occurs when an electrical connection is formed between different regions during high-voltage operation, possibly creating a short condition between the two regions causing the device to fail. One attempt to solve this problem utilizes a barrier layer formed along a surface of a substrate. An epitaxial layer is grown on the substrate, and a transistor having high-voltage wells in the source/drain regions is then formed in the epitaxial layer.

This process, however, is time-consuming, expensive, and generally requires additional process steps. For example, the epitaxial layer is a time-consuming process and reduces the amount of units that may be produced within a given amount of time. Additionally, the high-voltage wells are different than the low-voltage wells used in other areas of the wafer. Accordingly, particularly in designs in which it is desirable to utilize low-voltage and high-voltage devices on a single substrate, high-voltage devices typically require additional processing steps and longer processing times.

Accordingly, there is a need for high-voltage devices that may be fabricated easily and cost-effectively, particularly in conjunction with low-voltage devices.

SUMMARY OF THE INVENTION

These and other problems are generally reduced, solved or circumvented, and technical advantages are generally achieved, by embodiments of the present invention, which provides high-voltage CMOS devices.

In accordance with an embodiment of the present invention, a high-voltage transistor is provided. The high-voltage transistor comprises a P-well and an N-well separated by a first distance, i.e., the P-well is not immediately adjacent to the N-well. A first source/drain region is located in one of the P-well and the N-well, and a second source/drain region is located in the other P-well and N-well, dependent upon whether an NMOS or a PMOS transistor is being formed.

The high-voltage transistor may include a deep N-well, which may be desirable when a PMOS transistor is being fabricated on a P-type substrate to provide additional isolation. Furthermore, the high-voltage transistor may include a body contact and/or an isolation structure (e.g., a shallow trench isolation, a field oxide, or the like) in the source and/or drain regions. The high-voltage transistor may further include doped isolation regions to further isolate well regions. For example, N-wells may be used to isolate P-wells from the substrate.

In an embodiment, a high-voltage transistor is formed on a substrate with low-voltage devices. For example, high-voltage transistors may be used for I/O functions and low-voltage devices may be used for core functions.

In an embodiment, the high-voltage transistor may be fabricated by forming a first well of the first conductivity type near a surface of a semiconductor substrate, and forming a second well of a second conductivity type near the surface of the semiconductor substrate, the first well and the second well being separated by a first distance. The high-voltage transistor may then be formed such that a first source/drain region is formed in the first well and a second source/drain region is formed in the second well. One of ordinary skill in the art will appreciate that these steps may be used to fabricate either an NMOS or a PMOS high-voltage transistor.

The first and/or second well may be formed simultaneously as forming a similar well in a low-voltage region for a low-voltage transistor. In this manner, low-voltage transistors and high-voltage transistors may be fabricated in an efficient and cost-effective manner.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include:

FIG. 11 illustrates a cross-section of a wafer having a lateral-diffused NMOS device having an isolation region formed thereon in accordance with an embodiment of the present invention; and FIG. 12 illustrates a cross-section of a wafer having a lateral-diffused NMOS device with an isolation region and a body contact formed thereon in accordance with an embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1-4 illustrate various stages of fabricating a semiconductor device having high-voltage PMOS and NMOS transistors and low-voltage PMOS and NMOS transistors in accordance with an embodiment of the present invention. It should be noted that the following method illustrates the formation of one of each of these transistors for illustrative purposes only, and embodiments of the present invention may be used to fabricate semiconductor devices having any combination of one or more these transistors. A high-voltage transistor includes transistors expecting more than about 5 volts, and a low-voltage transistor includes transistors expecting less than about 5 volts. As one of ordinary skill in the art will appreciate, one of the advantages of an embodiment of the present invention is the ability to integrate the process of simultaneously forming a high-voltage transistor and a low-voltage transistor with no or fewer additional steps, thereby simplifying the processing and lowering costs. Furthermore, it has been found that embodiments of the present invention may increase the breakdown current of the transistors.

Figure 1:
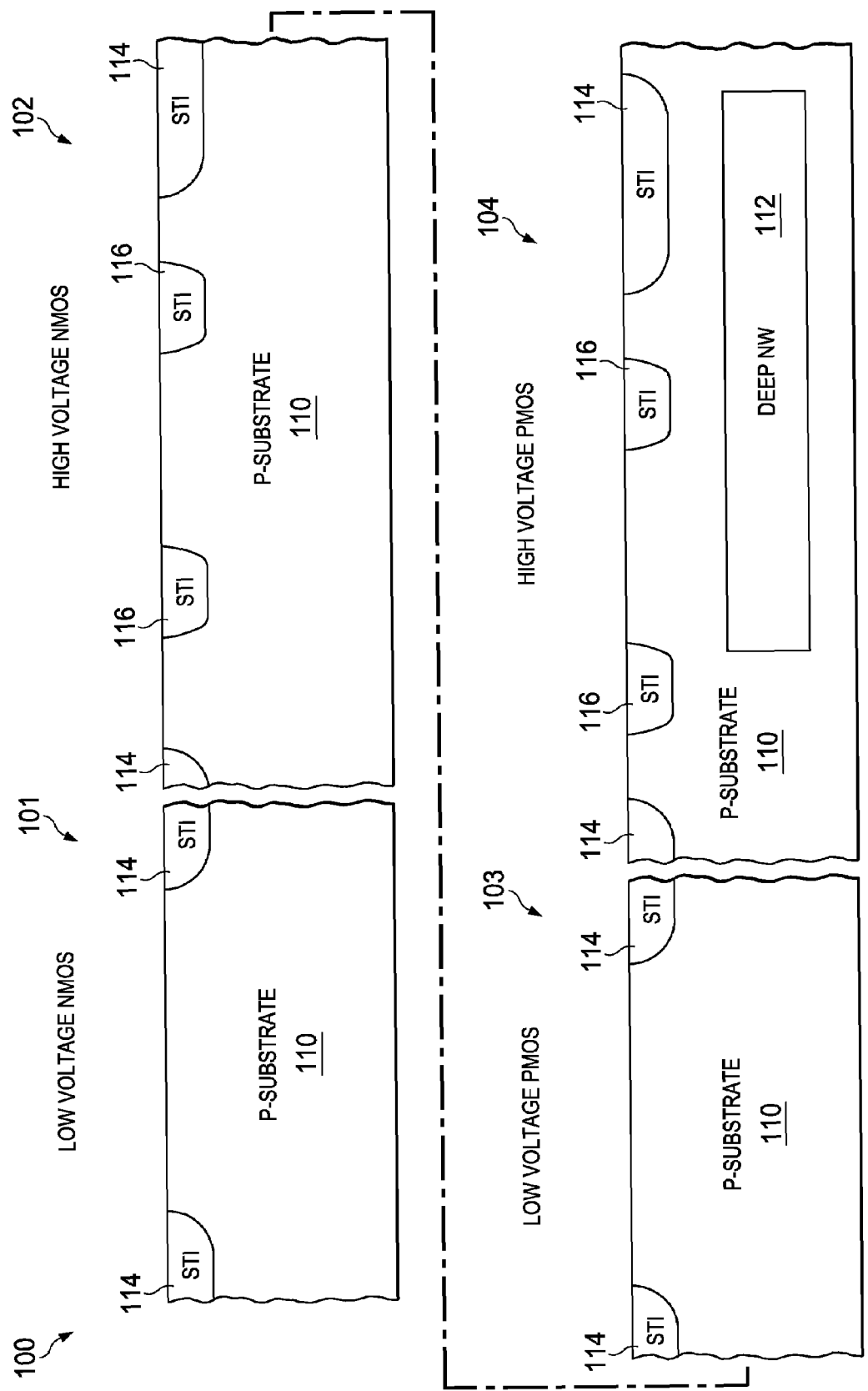
FIGS. 1-4 illustrate cross-sections of a wafer after various process steps have been performed to fabricate a high-voltage device in accordance with an embodiment of the present invention.

Referring first to FIG. 1, a wafer 100 is shown comprising a substrate 110 having four regions: a low-voltage NMOS region 101, a high-voltage NMOS region 102, a low-voltage PMOS region 103, and a high-voltage PMOS region 104. In an embodiment, the substrate 110 comprises a bulk silicon substrate. Other materials, such as germanium, silicon-germanium alloy, or the like, could alternatively be used for the substrate 110. Additionally, the substrate 110 may be a semiconductor-on-insulator (SOI) substrate, a silicon-on-saphire substrate (SOS), or a multi-layered structure, such as a silicon-germanium layer formed on a bulk silicon layer. Other materials may be used. It should be noted that the embodiment discussed herein assumes that the substrate 110 is a P-type substrate for illustrative purposes only and that other types of substrates may be used.

A deep N-well 112 may be formed in the high-voltage PMOS region 104 by masking (not shown) the substrate 110 as is known in the art and implanting N-type ions. It is preferred that the deep N-well 112 be formed about 1 µm to about 6 µm below the surface of the substrate 110, thereby leaving a portion of the substrate 110 between the deep N-well 112 and the surface of the substrate 110, wherein the substrate 110 above the deep N-well has a P-type conductivity. The deep N-well 112 may be doped with, for example, an N-type dopant, such as phosphorous ions at a dose of about 1E12 to about 1E15 atoms/cm$^2$ and at an energy of about 1000 to about 3000 KeV. Alternatively, the deep N-well 112 may be doped with other N-type dopants such as arsenic, antimony, or the like. In an embodiment, the deep N-well 112 has a thickness of about 1 µm to about 6 µm.

Shallow-trench isolations (STIs) 114, or some other isolation structures such as field oxide regions, may be formed in the substrate 110 to isolate active areas on the substrate. The STIs 114 may be formed by etching trenches in the substrate and filling the trenches with a dielectric material, such as silicon dioxide, a high-density plasma (HDP) oxide, or the like.

STIs 116 may be added in a similar manner as the STIs 114 to provide further insulation and prevent or reduce gate leakage if desired for a specific application. Applications in which STIs 116 may be useful include applications using body contacts, laterally-diffused drains, double-diffused drains, and the like. Some of these other embodiments of the present invention are illustrated in FIGS. 5-14.

Figure 2:
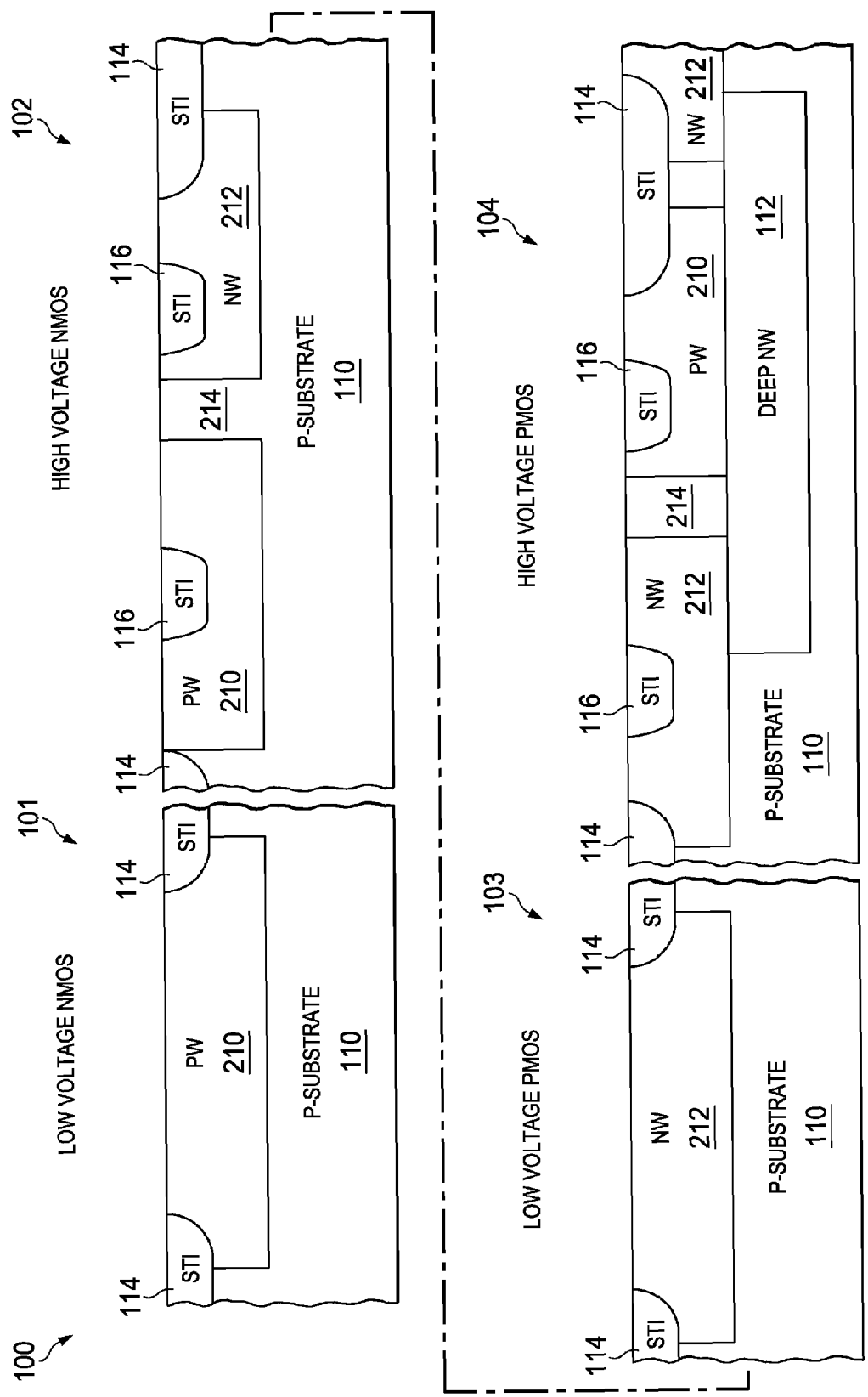

FIG. 2 illustrates the wafer 100 after P-wells 210 and N-wells 212 have been formed in accordance with an embodiment of the present invention. It should be noted that the P-wells 210 and the N-wells 212 may be doped at a lower ion concentration sufficient for low-voltage devices and are preferably simultaneously formed in the low-voltage NMOS region 101, high-voltage NMOS region 102, low-voltage PMOS region 103, and high-voltage PMOS region 104.

As described above, high-voltage devices have generally required an N-well and/or a P-well having a higher dopant concentration than the dopant concentration required for low-voltage devices. As a result, the P-wells 210 and N-wells 212 in the high-voltage PMOS and NMOS regions 102, 104 were typically formed in separate process steps than the P-wells 210 and N-wells 212 in the low-voltage PMOS and NMOS regions 101, 103. Embodiments of the present invention in which the P-wells 210 and N-wells 212 are not immediately adjacent in the high-voltage PMOS and NMOS regions 102, 104, however, allow the high-voltage devices formed in the high-voltage PMOS and NMOS regions 102, 104 to utilize a well region having a dopant concentration sufficient for low-voltage devices formed in the low-voltage PMOS and NMOS regions 101, 103. As a result, well regions for the low-voltage devices may be formed in the same process steps as well regions for the high-voltage devices, thereby reducing processing time and costs.

The P-well 210 may be formed by implantation with, for example, boron ions at a dose of about 1E12 to about 1E14 atoms/cm$^2$ and at an energy of about 50 to about 800 KeV. Other P-type dopants, such as aluminum, gallium, indium, or the like, may also be used. In an embodiment, the P-well 210 has a depth of about 0 µm to about 2 µm.

The N-well 212 may be formed by implantation with, for example, phosphorous ions at a dose of about 1E12 to about 1E14 atoms/cm$^2$ and at an energy of about 50 to about 1000 KeV. Other N-type dopants, such as antimony, or the like, may also be used. In an embodiment, the N-well 212 has a depth of about 0 µm to about 2 µm.

In accordance with an embodiment of the present invention, the P-well 210 and the N-well 212 formed within the high-voltage NMOS region 102 and the high-voltage PMOS region 104 are formed such that the P-well 210 and the N-well 212 are not immediately adjacent to each other. In other words, an interposed region 214 is positioned between the P-well 210 and the N-well 212. The interposed region 214 is preferably a portion of the substrate 110 above the deep N-well 112. Preferably, the interposed region 214 has a dopant concentration of about 1E14 to about 1E17 atoms/ cm³. The distance between the P-well 210 and the N-well 212 is preferably between about 0.2 µm and 1.5 µm.

Figure 3:
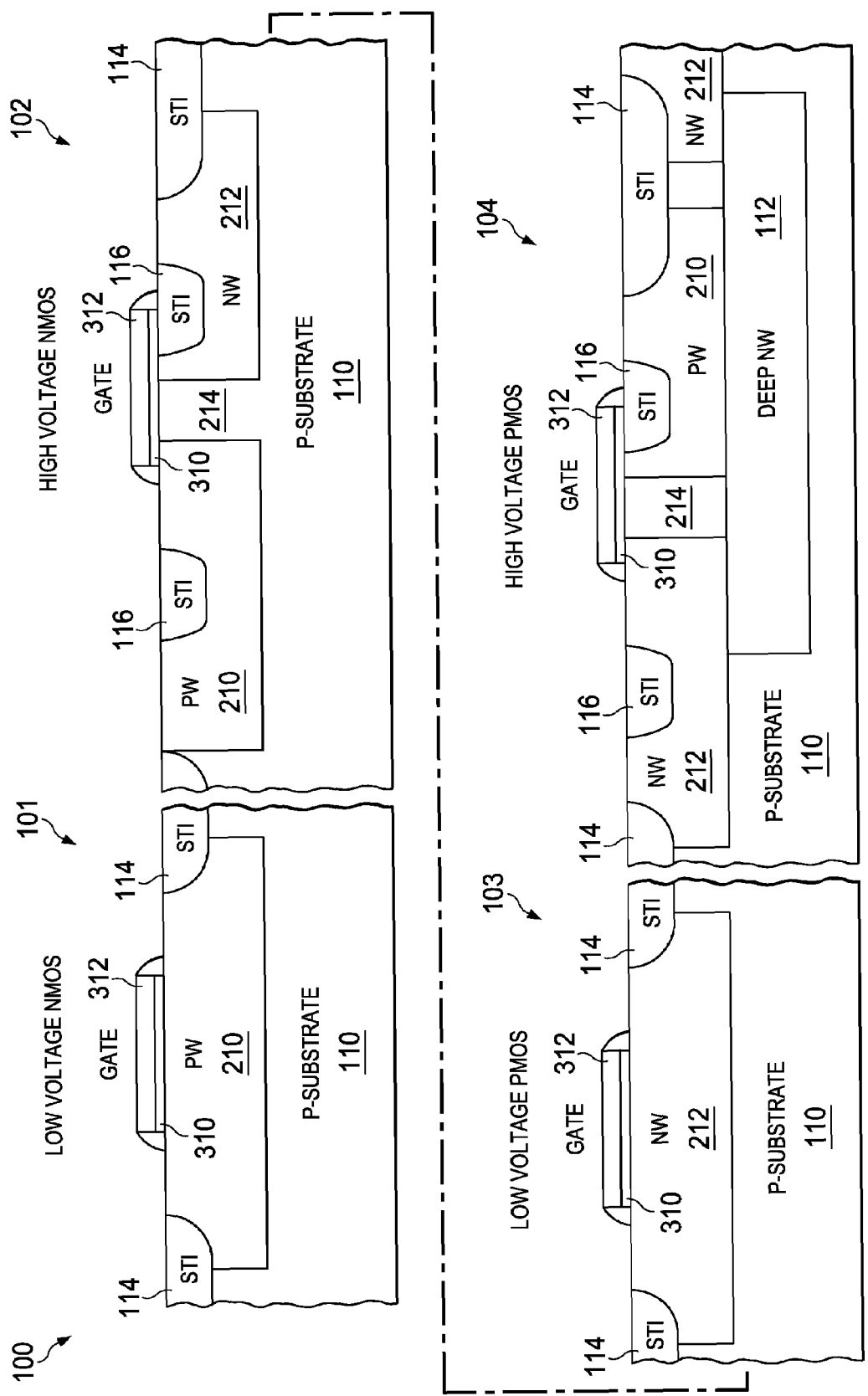

FIG. 3 illustrates the wafer 100 of FIG. 2 after a gate dielectric 310 and a gate electrode 312 have been formed in the low-voltage NMOS region 101, high-voltage NMOS region 102, low-voltage PMOS region 103, and high-voltage PMOS region 104 in accordance with an embodiment of the present invention. The gate dielectric 310 comprises a dielectric material, such as silicon dioxide, silicon oxynitride, silicon nitride, a nitrogen-containing oxide, a high-K metal oxide, a combination thereof, or the like. A silicon dioxide dielectric layer may be formed, for example, by an oxidation process, such as wet or dry thermal oxidation. In the preferred embodiment, the gate dielectric 310 is about 10 Å to about 200 Å in thickness. Other processes, materials, and thicknesses may be used.

The gate electrode 312 comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, a combination thereof, or the like. In one example, amorphous silicon is deposited and re-crystallized to create poly-crystalline silicon (polysilicon). The polysilicon layer may be formed by depositing doped or undoped polysilicon by low-pressure chemical vapor deposition (LPCVD) to a thickness in the range of about 200 Å to about 2000 Å, but more preferably about 300 Å to about 1000 Å.

The gate length of the gate electrode 312 is preferably about 1 µm to about 3 µm. As illustrated in FIG. 3, the gate dielectric 310 and the gate electrode 312 are formed over the interposed region 214 such that the interposed region 214 forms a portion of the channel region of the transistor. In an embodiment, an end of the gate electrode 312 formed in the high-voltage NMOS and PMOS regions 102, 104 is positioned above an isolation region, such as STI 116. By positioning the gate electrode 312 in this manner, gate leakage may be further reduced.

Figure 4:
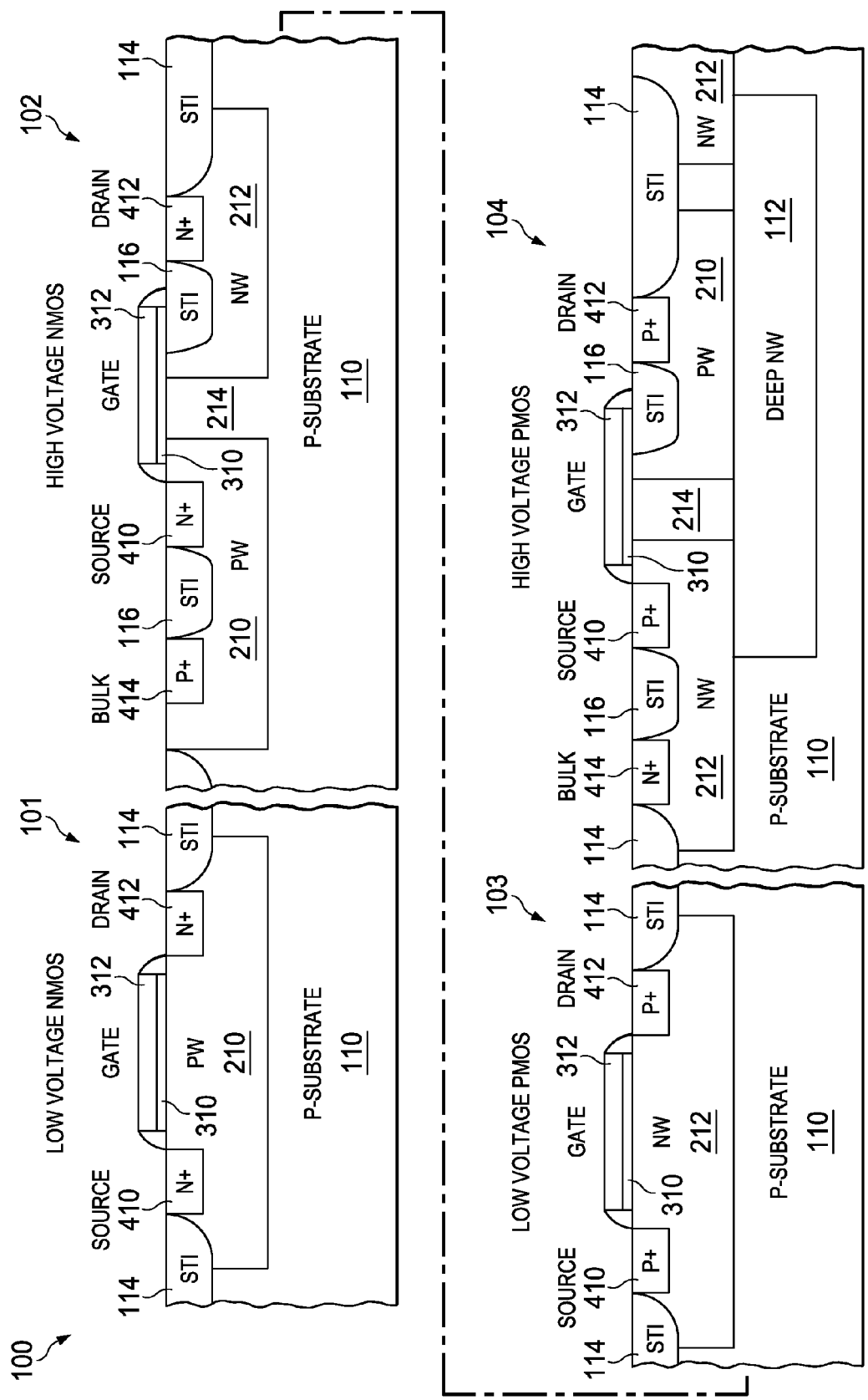

FIG. 4 illustrates the wafer 100 of FIG. 3 after source regions 410, drain regions 412, and bulk contacts 414 have been formed in accordance with an embodiment of the present invention. The source/drain regions 410, 412 may be formed using one or more implant processes and one or more spacers. In a preferred embodiment, the source regions 410 and drain regions 412 comprise laterally-diffused drains known in the art. However, additional doping profiles, spacers, and the like may be used. For example, the source regions 410 and drain regions 412 may comprise vertically-diffused drains, lightly-doped drains, double-diffused drains, or the like. (Examples of preferred embodiments of PMOS and NMOS devices utilizing double-diffused drains are provided in FIGS. 6, 7, 9, & 10.) The bulk contacts 414 may be formed during the same process steps as the source regions 410 and/or the drain regions 412.

Thereafter, standard processes may be used to complete fabrication of the wafer 100 and to dice the wafer 100 into individual dies in preparation for packaging.

FIGS. 5-14 provide examples of further embodiments of the present invention. One of ordinary skill in the art will appreciate that the processing techniques described above with reference to FIGS. 1-4 may be used to fabricate the devices illustrated in FIGS. 5-14.

Figure 5:
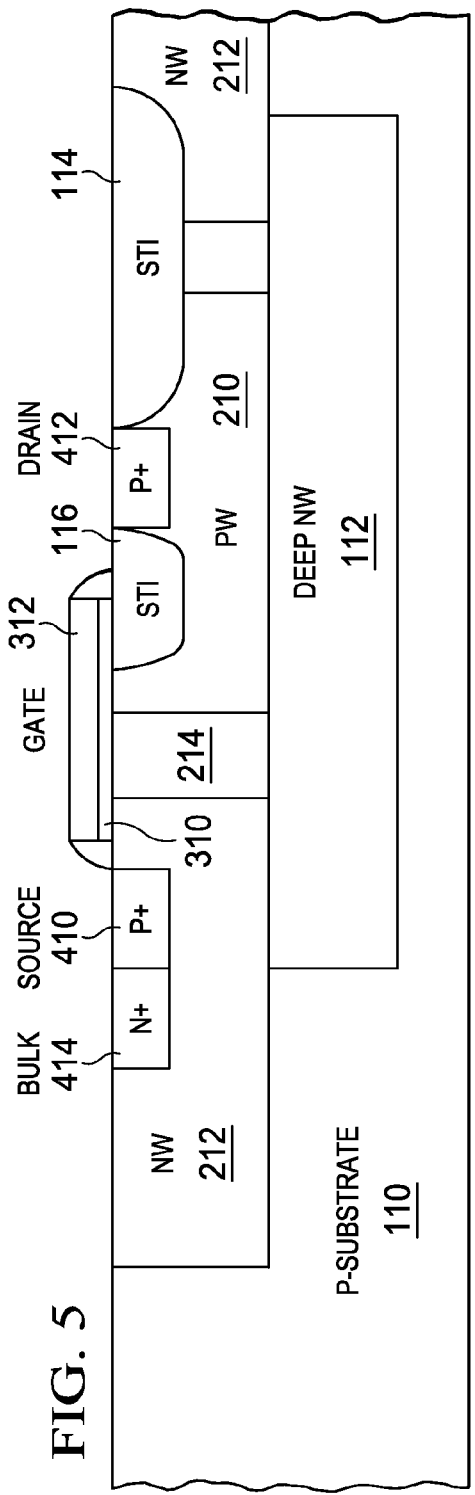
FIG. 5 illustrates a cross-section of a wafer having a lateral-diffused PMOS device with a body contact formed thereon in accordance with an embodiment of the present invention.

FIG. 5 illustrates a lateral-diffused PMOS (LDPMOS) device having a body contact in accordance with an embodiment of the present invention. In this embodiment, the STI 116 (see FIG. 4) in the source region of the high-voltage PMOS 104 has been omitted.

Figure 6:
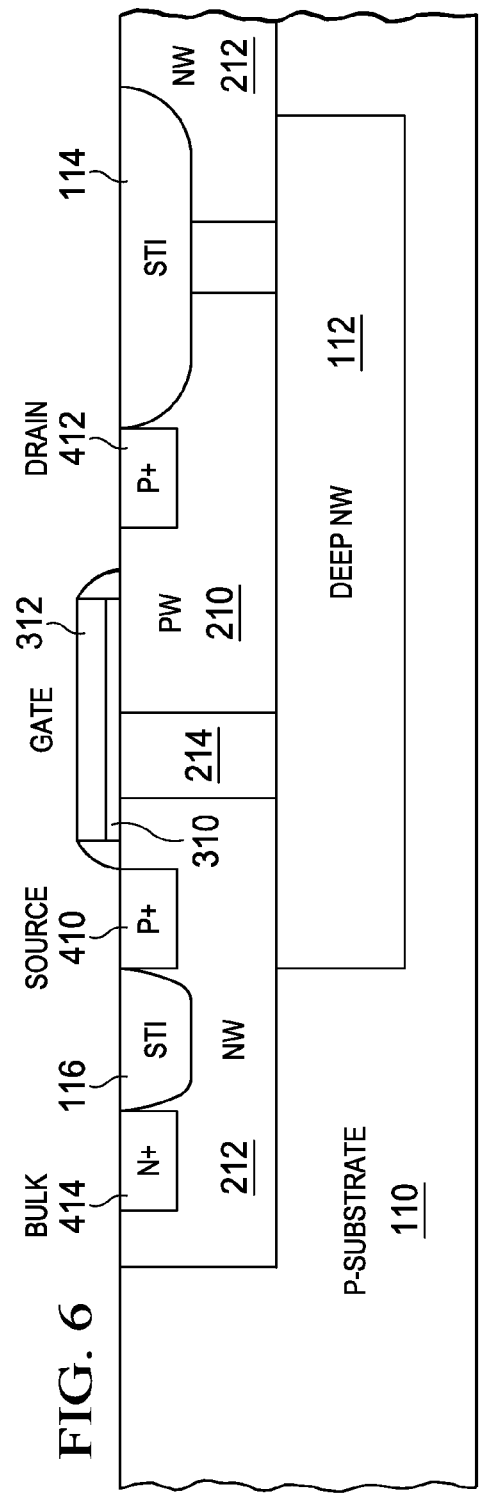
FIG. 6 illustrates a cross-section of a wafer having a double-diffused drain PMOS device formed thereon in accordance with an embodiment of the present invention.

FIG. 6 illustrates a double-diffused drain PMOS (DDDPMOS) device in accordance with an embodiment of the present invention. As shown in FIG. 6, when using a double-diffused drain, it may be desirable to omit the STI 116 (see FIG. 4) in the drain region.

Figure 7:
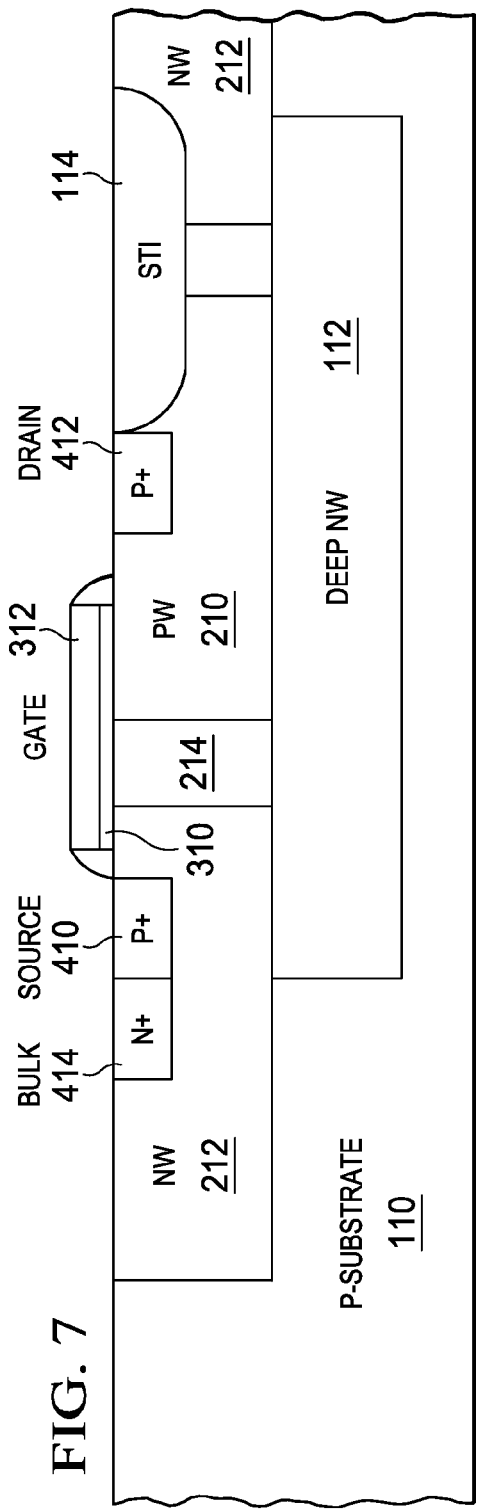
FIG. 7 illustrates a cross-section of a wafer having a double-diffused drain PMOS device with a body contact formed thereon in accordance with an embodiment of the present invention.

FIG. 7 illustrates a DDDPMOS device having a body contact in accordance with an embodiment of the present invention. In this embodiment, it may be desirable to omit STIs 116 (see FIG. 4) in the source and drain regions.

Figure 8:
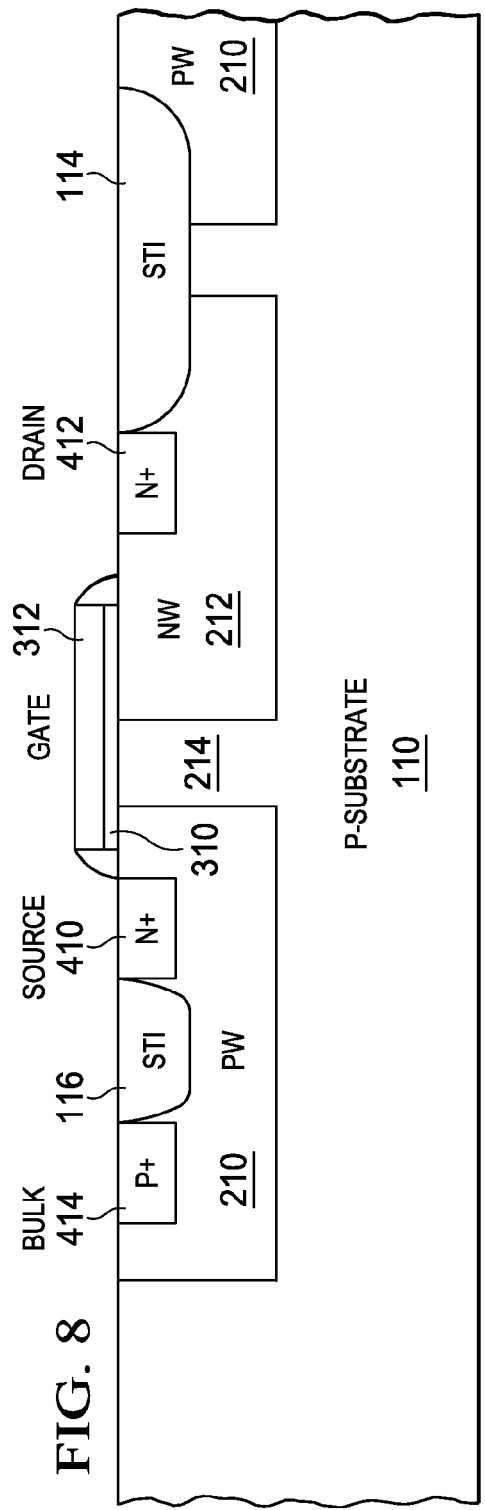
FIG. 8 illustrates a cross-section of a wafer having a lateral-diffused NMOS device with a body contact formed thereon in accordance with an embodiment of the present invention.

FIG. 8 illustrates a lateral-diffused NMOS (LDNMOS) device having a body contact in accordance with an embodiment of the present invention. In this embodiment, the STI 116 (see FIG. 4) in the drain region of the high-voltage PMOS 104 has been omitted.

Figure 9:
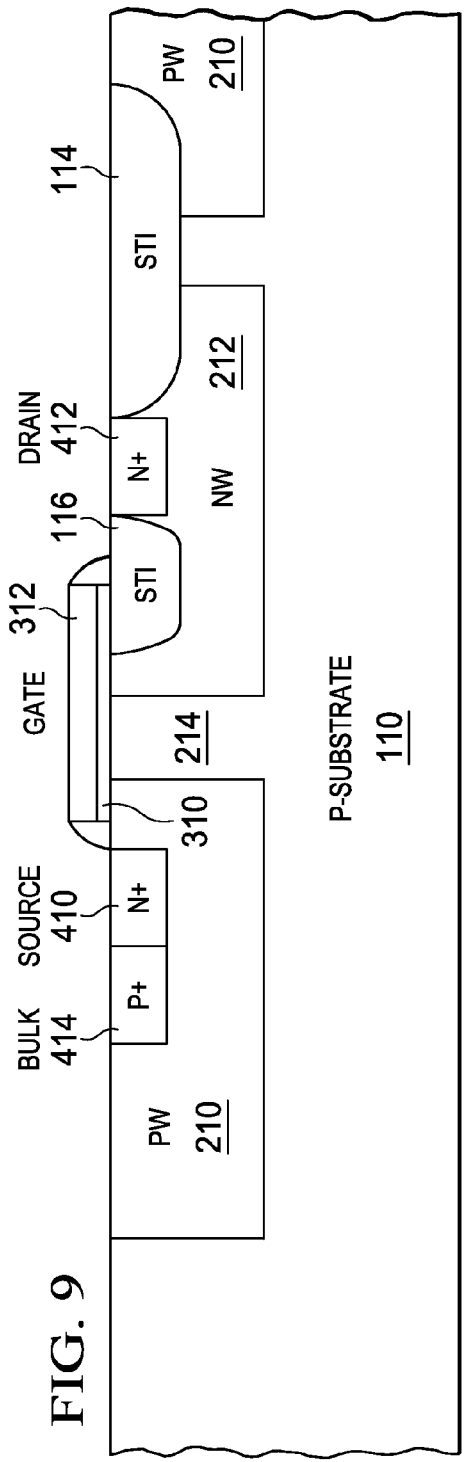
FIG. 9 illustrates a cross-section of a wafer having a double-diffused drain NMOS device formed thereon in accordance with an embodiment of the present invention.

FIG. 9 illustrates a double-diffused drain NMOS (DDDNMOS) device in accordance with an embodiment of the present invention. As shown in FIG. 9, when using a double-diffused drain in an NMOS device, it may be desirable to omit the STI 116 (see FIG. 4) in the source region.

Figure 10:
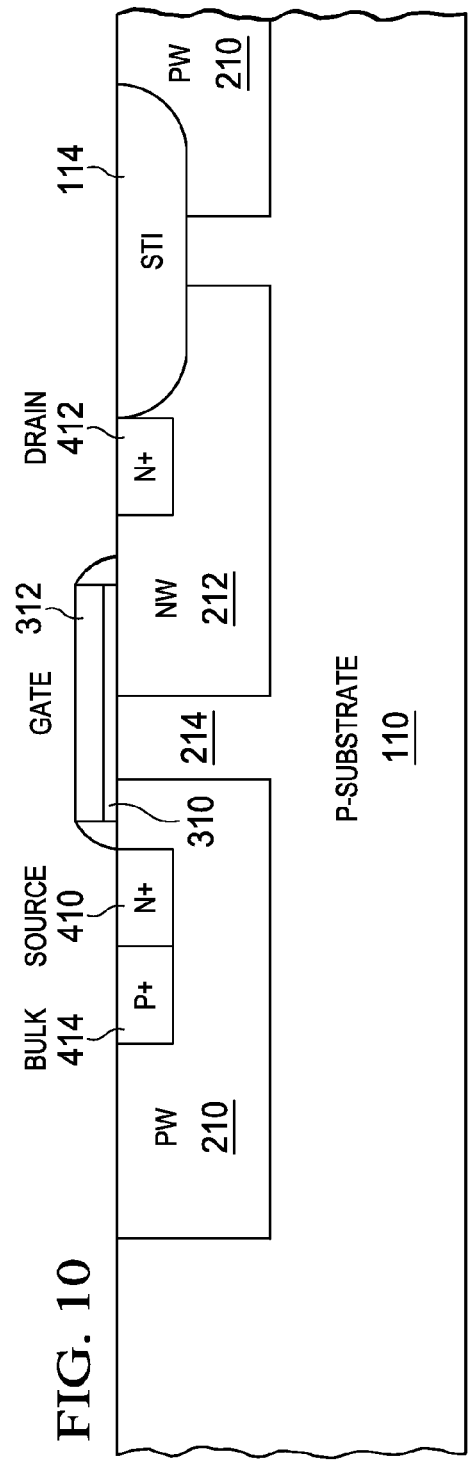
FIG. 10 illustrates a cross-section of a wafer having a double-diffused drain NMOS device with a body contact formed thereon in accordance with an embodiment of the present invention.

FIG. 10 illustrates a DDDNMOS device having a body contact in accordance with an embodiment of the present invention. In this embodiment, it may be desirable to omit STIs 116 (see FIG. 4) in the source and drain regions.

FIGS. 11-14 illustrate embodiments in which a doped isolation well 1110 is used to further isolate P-well regions 210 in the source region of an NMOS device. Doped isolation well 1110 may be particularly useful in embodiments in which the potential of P-well regions 210 can be different from the potential of P-substrate region 110. The doped isolation well 1110 may be formed simultaneously with the N-wells 212.

FIG. 12 illustrates a LDNMOS device having a body contact and a doped isolation well 1110 in accordance with an embodiment of the present invention. In this embodiment, the STI 116 (see FIG. 4) in the drain region of the high-voltage NMOS has been omitted.

Figure 13:
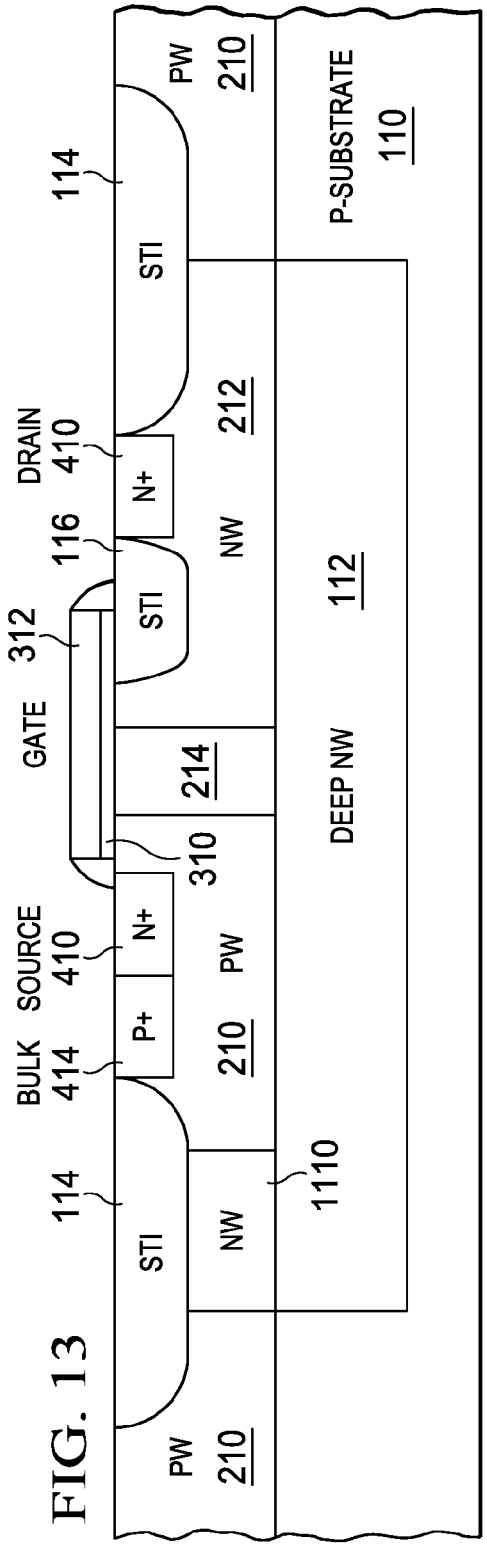
FIG. 13 illustrates a cross-section of a wafer having a double-diffused drain NMOS device having an isolation region formed thereon in accordance with an embodiment of the present invention.

FIG. 13 illustrates a DDDNMOS device having a doped isolation well 1110 in accordance with an embodiment of the present invention. As shown in FIG. 13, when using a double-diffused drain in an NMOS device, it may desirable to omit the STI 116 (see FIG. 4) in the source region.

Figure 14:
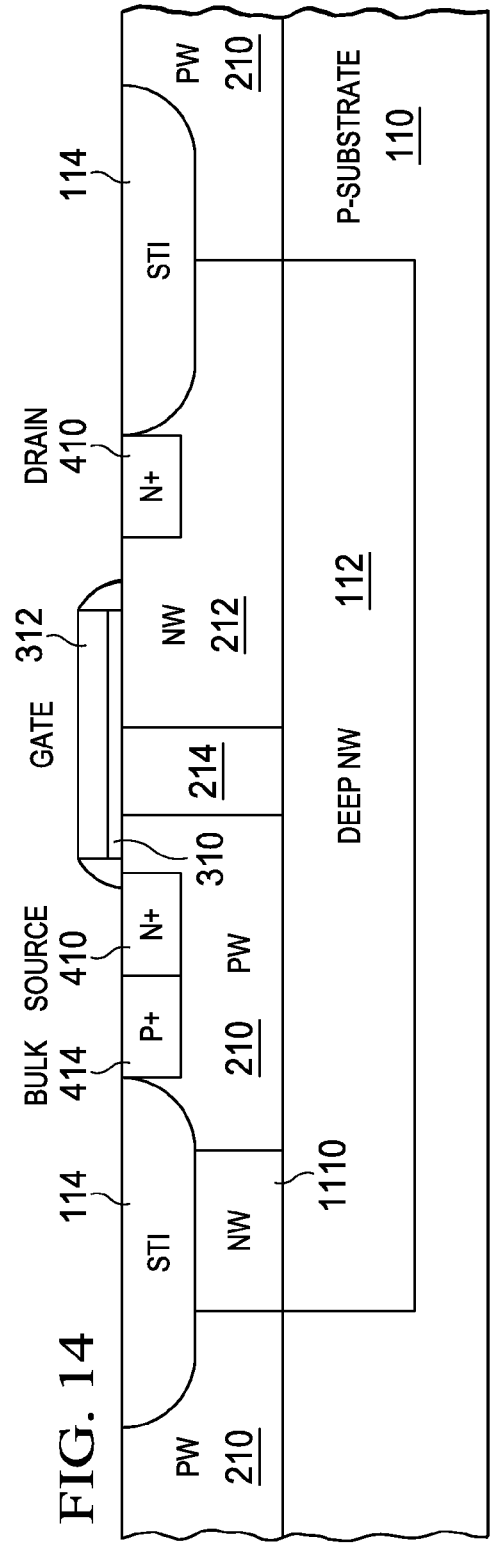
FIG. 14 illustrates a cross-section of a wafer having a double-diffused drain NMOS device with an isolation region and a body contact formed thereon in accordance with an embodiment of the present invention.

FIG. 14 illustrates a DDDNMOS device having a body contact and a doped isolation well 1110 in accordance with an embodiment of the present invention. In this embodiment, it may be desirable to omit STIs 116 (see FIG. 4) in the source and drain regions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor substrate;
   a first well of a first conductivity type near a surface of the semiconductor substrate;
   a second well of a second conductivity type near the surface of the semiconductor substrate, the first well and the second well being separated by a first distance;
   a transistor having a first source/drain region formed in the first well and a second source/drain region formed in the second well, the first and second source/drain regions being separated from the semiconductor substrate underlying the first well and the second well by a doped region having a conductivity type opposite that of the source/drain region, the doped region comprising either the first well, the second well, or a deep well subjacent to the first well or the second well and having a conductivity type opposite the first and second source/drain regions;
   a bulk contact region of the first conductivity type in the first well, the bulk contact region having a higher dopant concentration than the first well; and
   an isolation structure in the first well between the bulk contact region and the first source/drain region.

2. The semiconductor device of claim 1, wherein the first distance is between about 0.2 μm to about 1.5 μm.

3. The semiconductor device of claim 1, further comprising an isolation structure in the second well, a gate of the transistor being formed on at least a portion of the isolation structure.

4. The semiconductor device of claim 1, further comprising a doped isolation well of the second conductivity type adjacent the first well, the doped isolation well being on an opposing side from the second well.

5. A semiconductor device comprising:
   a semiconductor substrate having a high-voltage region and a low-voltage region;
   a high-voltage transistor in the high-voltage region, the high-voltage transistor having a first well of a first conductivity type and a second well of a second conductivity type separated by a first distance, the high-voltage transistor having a substantially planar gate electrode, source/drain regions of the high-voltage transistor being separated from the underlying semiconductor substrate by a doped region having a conductivity type opposite the source/drain regions, the doped region being the first or second well or a deep well immediately below the first or second well; and
   a low-voltage transistor in the low-voltage region.

6. The semiconductor device of claim 5, wherein the first distance is between about 0.2 μm to about 1.5 μm.

7. The semiconductor device of claim 5, wherein the high-voltage transistor has a gate length between about 1.0 μm to about 3.0 μm.

8. The semiconductor device of claim 5, further comprising one or more isolation structures separating the high-voltage region and the low-voltage region.

9. The semiconductor device of claim 5, further comprising forming an isolation structure in the first well, a gate of the high-voltage transistor being positioned over at least a portion of the isolation structure.

10. The semiconductor device of claim 5, further comprising forming an isolation structure in the first well, the isolation structure being on an opposing side of a source region from the second well.

11. The semiconductor device of claim 5, further comprising forming a bulk contact in the first well of the first conductivity type, the bulk contact having a higher ion concentration of the first conductivity type than the first well.

12. The semiconductor device of claim 5, further comprising a doped isolation well adjacent the first well on an opposing side from the second well.

13. A semiconductor device comprising:
   a semiconductor substrate;
   a first well of a first conductivity type near a surface of the semiconductor substrate;
   a second well of a second conductivity type near the surface of the semiconductor substrate, the first well and the second well being separated by an interposed region;
   a transistor having a gate electrode, first source/drain region formed in the first well and a second source/drain region formed in the second well;
   doped regions interposed between the first and second source/drain regions and the underlying semiconductor substrate, the doped regions being of a conductivity type opposite the first and second source/drain regions, the doped regions being either the first well, the second well, or a third well, the third well being immediately below the first well or the second well and having an opposite conductivity type than the first and second source/drain regions;
   a bulk contact region of the first conductivity type in the first well, the bulk contact region having a higher dopant concentration than the first well; and
   a shallow trench isolation (STI) in the second well between the second source/drain region and the interposed region.

14. The semiconductor device of claim 13, wherein the interposed region has a width between about 0.2 μm to about 1.5 μm.

15. The semiconductor device of claim 13, wherein the gate electrode of the transistor is formed on at least a portion of the STI.

16. The semiconductor device of claim 13, further comprising a doped isolation well of the second conductivity type adjacent the first well, the doped isolation well being on an opposing side from the second well.

* * * * *